(12) United States Patent
Jung et al.

(10) Patent No.: US 8,772,779 B2
(45) Date of Patent: Jul. 8, 2014

(54) DISPLAY SUBSTRATE FOR DRIVING AN ELECTROLUMINESCENT ELEMENT

(75) Inventors: Kwang-Chul Jung, Seongnam-si (KR); Baek-Woon Lee, Yongin-si (KR); Joon-Chul Goh, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/589,866

(22) Filed: Aug. 20, 2012

(65) Prior Publication Data

US 2012/0306730 A1  Dec. 6, 2012

Related U.S. Application Data

(62) Division of application No. 12/338,870, filed on Dec. 18, 2008, now Pat. No. 8,268,681.

(30) Foreign Application Priority Data

Feb. 15, 2008  (KR) .................. 10-2008-0013953

(51) Int. Cl.
    *H01L 29/04*  (2006.01)
(52) U.S. Cl.
    USPC ...... 257/59; 438/166; 438/149; 257/E21.413; 257/E29.004
(58) Field of Classification Search
    CPC ...................................................... G09G 3/30
    USPC ............... 438/149, 166; 257/59, E21.413, 257/E29.004
    See application file for complete search history.

(56) References Cited

U.S. PATENT DOCUMENTS

| | | | |
|---|---|---|---|
| 5,349,366 A * | 9/1994 | Yamazaki et al. ............... | 345/92 |
| 6,023,308 A * | 2/2000 | Takemura ........................ | 349/42 |
| 6,500,700 B1 | 12/2002 | Kawai | |
| 6,693,301 B2 * | 2/2004 | Takemura ........................ | 257/72 |
| 7,071,910 B1 * | 7/2006 | Takemura ........................ | 345/90 |
| 7,247,878 B2 * | 7/2007 | Park et al. ....................... | 257/40 |
| 7,253,440 B1 * | 8/2007 | Takemura ........................ | 257/72 |
| 7,462,865 B2 | 12/2008 | Jung et al. | |
| 7,521,859 B2 * | 4/2009 | Park .............................. | 313/505 |
| 7,709,838 B2 * | 5/2010 | Huh et al. ........................ | 257/57 |
| 7,803,029 B2 * | 9/2010 | Park ............................... | 445/24 |
| 7,812,527 B2 * | 10/2010 | Kim et al. ...................... | 313/506 |
| 7,863,602 B2 * | 1/2011 | Huh et al. ........................ | 257/40 |
| 2004/0135520 A1 * | 7/2004 | Park et al. ................... | 315/169.3 |
| 2005/0170643 A1 * | 8/2005 | Fujii et al. ..................... | 438/637 |
| 2005/0179625 A1 * | 8/2005 | Choi et al. ...................... | 345/76 |
| 2005/0287721 A1 * | 12/2005 | Yamamoto et al. ........... | 438/149 |
| 2006/0197086 A1 * | 9/2006 | Rhee et al. ...................... | 257/59 |
| 2006/0250537 A1 * | 11/2006 | Lee ................................ | 349/43 |
| 2007/0040954 A1 | 2/2007 | Lee et al. | |

(Continued)

*Primary Examiner* — Kimberly Rizkallah
*Assistant Examiner* — Caleb Henry
(74) *Attorney, Agent, or Firm* — Innovation Counsel LLP

(57) ABSTRACT

A display substrate includes a driving element, a switching element, a gate line, a data line, a driving voltage line and an electroluminescent element. The driving element includes a driving control electrode formed from a first conductive layer, and a driving input electrode and a driving output electrode formed from a second conductive layer. The switching element includes a switching control electrode formed from the second conductive layer, and a switching input electrode and a switching output electrode formed from a third conductive layer. The gate and data lines are formed from the second and third conductive layers, respectively. The driving voltage line is formed from the third conductive layer. Thus, misalignment between upper and lower patterns may be prevented to improve the reliability of a manufacturing process and increase an aperture ratio, thereby enhancing display quality.

7 Claims, 7 Drawing Sheets

(56) References Cited

U.S. PATENT DOCUMENTS

| | | | |
|---|---|---|---|
| 2007/0096097 A1* | 5/2007 | Kim et al. | 257/59 |
| 2007/0105286 A1 | 5/2007 | Huh et al. | |
| 2007/0117257 A1* | 5/2007 | Kim et al. | 438/99 |
| 2007/0161160 A1 | 7/2007 | Chen | |
| 2007/0188089 A1* | 8/2007 | Choi et al. | 313/506 |
| 2007/0194705 A1* | 8/2007 | Sung et al. | 313/506 |
| 2007/0242176 A1 | 10/2007 | Chang et al. | |
| 2008/0061295 A1 | 3/2008 | Wang et al. | |
| 2008/0118743 A1 | 5/2008 | Lee et al. | |
| 2008/0150435 A1 | 6/2008 | Park et al. | |
| 2008/0164470 A1 | 7/2008 | Wang et al. | |
| 2008/0179598 A1 | 7/2008 | Kim et al. | |
| 2009/0130786 A1* | 5/2009 | Park | 438/22 |

* cited by examiner 120 122 124 126

121 123 AP1   127 129

DISPLAY SUBSTRATE FOR DRIVING AN ELECTROLUMINESCENT ELEMENT

CROSS-REFERENCE TO RELATED APPLICATIONS

The present application is a divisional application of U.S. patent application Ser. No. 12/338,870 filed on Dec. 18, 2008, which claims priority under 35 U.S.C. §119 to Korean Patent Application No. 10-2008-0013953, filed on Feb. 15, 2008 in the Korean Intellectual Property Office (KIPO), the contents of which are herein incorporated by reference in their entireties.

BACKGROUND OF THE INVENTION

1. Field of the Invention

The present invention relates to a display substrate and a method of manufacturing the display substrate. More particularly, the present invention relates to a display substrate for an electroluminescent display device and a method of manufacturing the display substrate.

2. Description of the Related Art

Nowadays, organic light-emitting diode (OLED) display devices are attracting attention as display devices that can overcome problems of liquid crystal display (LCD) devices. An OLED device includes two electrodes and an organic light-emitting layer disposed between the two electrodes. An electron injected from one electrode and a hole injected from the other electrode are combined with each other in the organic light-emitting layer to form an exciton, and the exciton discharges energy and emits light. The OLED device corresponds to a self-light-emitting device, and does not require a separate light source. Thus, power consumption is low, and display quality, including factors such as response time, viewing angle, contrast ratio, etc., is excellent.

The OLED device of an active matrix type includes a switching thin-film transistor (TFT) connected to a signal line to control a data voltage and a driving TFT receiving the data voltage and applying the data voltage to a control electrode, so that current passes through a light-emitting element.

In order to obtain optimized characteristics of the OLED device, the switching TFT and the driving TFT require different characteristics from each other. The switching TFT requires a high on/off current ratio ($I_{on}/I_{off}$). In contrast, the driving TFT requires high electric mobility and stability so that sufficient current may pass through a light-emitting element.

Thus, the driving TFT typically employs a polysilicon TFT having high electric mobility. In order to manufacture the polysilicon TFT, a method in which amorphous silicon is heat-treated in a furnace at a high temperature of about 600° C. to about 700° C. to be crystallized into polysilicon is usually used. However, a glass substrate is expanded during the above heat-treatment process, so that misalignment between upper and lower patterns is generated to deteriorate the reliability of a manufacturing process.

SUMMARY OF THE INVENTION

The present invention obviates the above problems, and thus the present invention provides a display substrate capable of preventing misalignment and increasing an aperture ratio.

The present invention also provides a method of manufacturing the above-mentioned display substrate.

In one aspect of the present invention, a display substrate includes a driving element, a switching element, a gate line, a data line, a driving voltage line and an electroluminescent element. The driving element includes a driving control electrode formed from a first conductive layer, and a driving input electrode and a driving output electrode that are formed from a second conductive layer and formed on the driving control electrode. The switching element includes a switching control electrode formed from the second conductive layer, and a switching input electrode and a switching output electrode that are formed from a third conductive layer and formed on the switching control electrode. The gate line is formed from the second conductive layer and connected to the switching control electrode. The data line is formed from the third conductive layer and connected to the driving input electrode. The driving voltage line is formed from the third conductive layer and electrically connected to the driving input electrode. The electroluminescent element is electrically connected to the driving output electrode.

The driving element may include a first active pattern formed on the driving control electrode. The first active pattern may include polysilicon.

The switching element may include a second active pattern formed on the switching control electrode. The second active pattern may include amorphous silicon.

The switching output electrode may make direct contact with the driving control electrode, and thus the driving element may be electrically connected to the switching element. The driving voltage line may make direct contact with the driving input electrode, and thus the driving element may be electrically connected to the driving voltage line.

In another aspect of the present invention, a method of manufacturing a display substrate is provided as follows. A first conductive layer, an insulation interlayer and an active layer are successively formed on a base substrate. The active layer, the insulation interlayer and the first conductive layer are simultaneously patterned to form a first active pattern, an insulation pattern and a driving control electrode. A switching control electrode connected to a gate line, and a driving input electrode and a driving output electrode overlapping the first active pattern are formed on the base substrate having the first active pattern. Here, the switching control electrode, the driving input electrode and the driving output electrode correspond to a second conductive layer. A data line crossing the gate line, a switching input electrode, a switching output electrode and a driving voltage line electrically connected to the driving input electrode are formed on the base substrate having the driving output electrode. Here, the data line, the switching input electrode, the switching output electrode and the driving voltage line correspond to a third conductive layer. An electroluminescent element electrically connected to the driving output electrode is formed.

The active layer may be crystallized, before the driving control electrode is formed. The active layer may include amorphous silicon, and may be crystallized to include polysilicon. The first active pattern may include polysilicon.

According to the present invention, a driving control electrode, an insulation pattern and a first active pattern of a driving element are patterned by using one mask to prevent misalignment between the driving control electrode and the first active pattern. Thus, the reliability of products and manufacturing processes thereof may be improved.

In addition, the driving element and a switching element are directly contacted with and electrically connected to each other to increase an aperture ratio of the display substrate and enhance display quality.

BRIEF DESCRIPTION OF THE DRAWINGS

The above and other features and advantage points of the present invention will become more apparent by describing in detailed exemplary embodiments thereof with reference to the accompanying drawings, in which.

DESCRIPTION OF THE EMBODIMENTS

Figure 1:
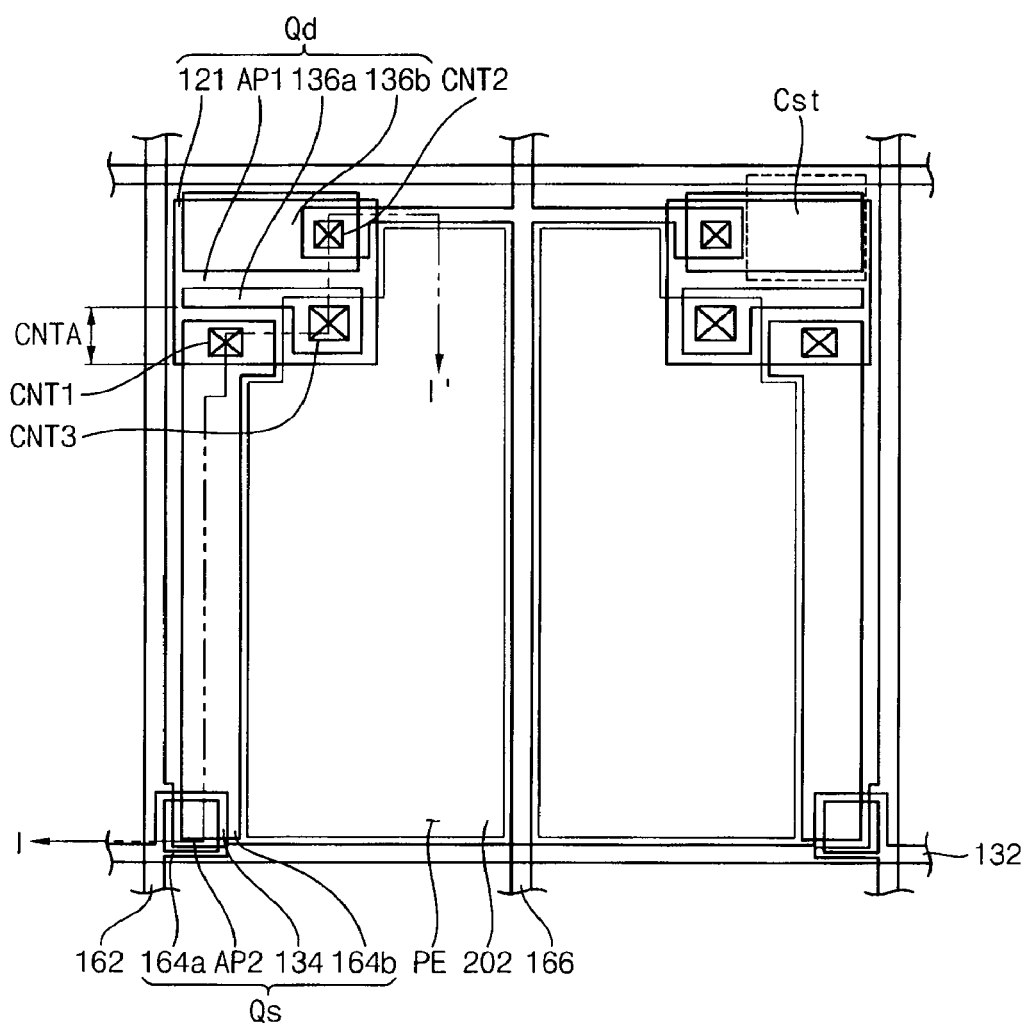
FIG. 1 is a plan view illustrating a display substrate according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
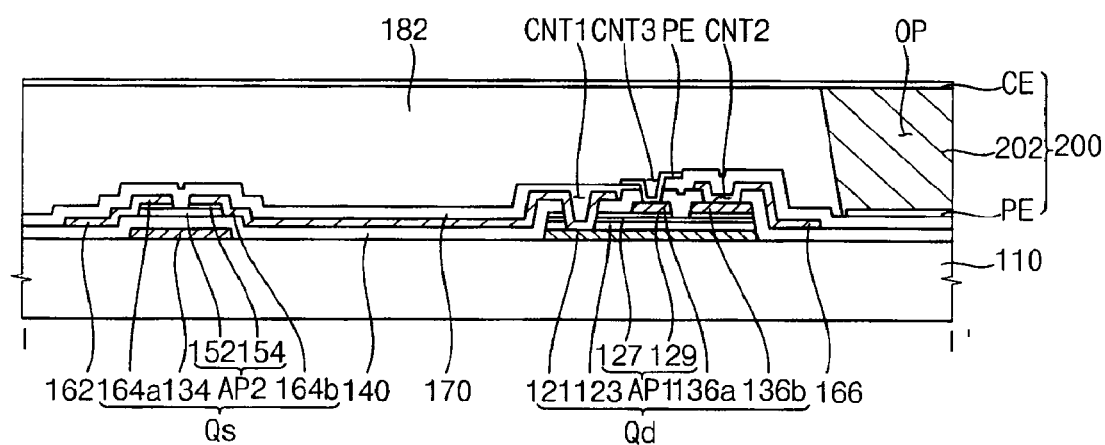
FIG. 2 is a cross-sectional view taken along a line I-I' in FIG. 1.

FIG. 1 is a plan view illustrating a display substrate according to an exemplary embodiment of the present invention. FIG. 2 is a cross-sectional view taken along a line I-I' in FIG. 1.

Referring to FIGS. 1 and 2, a display substrate according to an exemplary embodiment of the present invention includes an electroluminescent element 200 formed in a unit pixel. The display substrate includes a plurality of signal lines 132, 162 and 166 and a plurality of unit pixels connected to the signal lines 132, 162 and 166 and arranged in a substantially matrix shape. Each unit pixel includes a switching element Qs, a driving element Qd, an electroluminescent element 200 and a storage capacitor Cst.

The display substrate includes a gate line 132, a data line 162, a driving voltage line 166, a driving element Qd, a switching element Qs, an anode PE, a partition pattern 182, a light-emitting layer 202 and a cathode CE, which are formed on or over a base substrate 110.

The anode PE, the light-emitting layer 202 and the cathode CE define the electroluminescent element 200.

The gate line 132 corresponds to a signal line transferring a gate signal or a scan signal. The gate line 132 extends in a first direction D1 of the display substrate, and a plurality of gate lines 132 may be arranged in parallel in a second direction D2 that is different from the first direction D1. The first direction D1 and the second direction D2 may be substantially perpendicular to each other.

The data line 162 corresponds to a signal line transferring a data signal. The data line 162 extends in the second direction D2, and a plurality of the data lines 162 may be arranged in parallel in the first direction D1. The data line 162 crosses the gate line 132.

The driving voltage line 166 corresponds to a signal line transferring a driving voltage. The driving voltage line 166 is disposed between adjacent data lines 162, and transfers a driving voltage to pixels that are adjacent to each other in the first direction D1. Alternatively, one driving voltage line 166 may be formed corresponding to one data line 162.

The driving element Qd includes a driving control electrode 121, a driving input electrode 136b and a driving output electrode 136a. The driving element Qd is electrically connected to the switching element Qs, the electroluminescent element 200 and the driving voltage line 166.

The driving input electrode 136b and the driving output electrode 136a are formed on the driving control electrode 121, and spaced apart from each other. The driving element Qd is formed between the driving control electrode 121 and the driving input electrode 136b. The driving element Qd includes a first active pattern AP1 formed between the driving control electrode 121 and the driving output electrode 136a. The first active pattern AP1 may have substantially the same shape as the shape of the driving control electrode 121. In other words, sidewalls of the first active pattern AP1 may be coincident with sidewalls of the driving control electrode 121.

The first active pattern AP1 includes a first semiconductor layer 127 and a first ohmic contact layer 129. The driving element Qd may have high electric mobility to apply a driving voltage to the electroluminescent element 200. Thus, the first semiconductor layer 127 may include fine crystalline silicon or polysilicon, and the first ohmic contact layer 129 may include fine crystalline silicon or polysilicon doped with n-type impurities at a high concentration.

The switching element Qs includes a switching control electrode 134, a switching input electrode 164a and a switching output electrode 164b. The switching output electrode 164b makes contact with the driving control electrode 121 to thereby electrically connect the switching element Qs to the driving element Qd. The switching element Qs transfers a data signal from the data line 162 to the driving element Qd in response to a gate signal from the gate line 132.

The switching control electrode 134 is electrically connected to the gate line 132, the switching input electrode 164a is electrically connected to the data line 162, and the switching output electrode 164b is spaced apart from the switching input electrode 164a. The switching element Qs is formed between the switching control electrode 134 and the switching input electrode 164a. The switching element Qs includes a second active pattern AP2 formed between the switching control electrode 134 and the switching output electrode 164b.

The second active pattern AP2 includes a second semiconductor layer 152 and a second ohmic contact layer 154. The second semiconductor layer 152 includes amorphous silicon. The second ohmic contact layer 154 includes amorphous silicon doped with n-type impurities at a high concentration.

The driving control electrode 121 is formed by patterning a first conductive layer, and corresponds to a first pattern. An insulation pattern 123 is formed on the first pattern. The first active pattern AP1 is formed on the insulation pattern 123. The insulation pattern 123 may have substantially the same shape as the shape of the driving control electrode 121 and the shape of the first active pattern AP1. In other words, sidewalls of the insulation pattern 123 may be coincident with sidewalls of the driving control electrode 121 and sidewalls of the first active pattern AP1.

The driving control electrode 121, the insulation pattern 123 and the first active pattern AP1 may have substantially the same shape, because the driving control electrode 121, the insulation pattern 123 and the first active pattern AP1 are formed using one mask during a forming process. The driving control electrode 121, the insulation pattern 123 and the first active pattern AP1 are formed using one mask, to thereby prevent misalignment between the driving control electrode 121 and the first active pattern AP1.

The gate line 132, the switching control electrode 134, the driving input electrode 136b and the driving output electrode 136a are formed by patterning a second conductive layer, and correspond to a second pattern. A first insulation layer 140 may be formed on the second pattern. The second active pattern AP2 may be formed on the first insulation layer 140.

The data line 162, the switching input electrode 164a, the switching output electrode 164b and the driving voltage line 166 are formed by patterning a third conductive layer, and correspond to a third pattern. A second insulation layer 170 may be formed on the third pattern. The anode PE, the partition pattern 182, the light-emitting layer 202 and the cathode CE may be formed on the second insulation layer 170.

The storage capacitor Cst is formed corresponding to the driving control electrode 121 and the driving input electrode 136b of the driving element Qd. The storage capacitor Cst is defined by the driving control electrode 121, the driving input electrode 136b and the insulation pattern 123. The driving control electrode 121 and the driving input electrode 136b serve as a couple of electrodes, and the insulation pattern 123 serves as a dielectric layer between the couple of electrodes. The storage capacitor Cst may charge the data signal applied to the driving control electrode 121.

The insulation pattern 123, the first active pattern AP1 and the first insulation layer 140 have a first contact hole CNT1 partially exposing the driving control electrode 121. The driving control electrode 121 makes direct contact with the switching output electrode 164b via the first contact hole CNT1 to thereby electrically connect the driving element Qd to the switching element Qs.

The first insulation layer 140 has a second contact hole CNT2 partially exposing the driving input electrode 136b. The driving input electrode 136b makes direct contact with the driving voltage line 166 via the second contact hole CNT2 to thereby electrically connect the driving element Qd to the driving voltage line 166.

The first insulation layer 140 and the second insulation layer 170 have a third contact hole CNT3 partially exposing the driving output electrode 136a. The driving element Qd makes direct contact with the anode PE via the third contact hole CNT3, so that the driving element Qd is electrically connected to the anode PE.

The partition pattern 182 covers the gate line 132, the data line 162, the driving voltage line 166, the switching element Qs and the driving element Qd, and has an opening OP partially exposing the anode PE.

The electroluminescent element 200 may display a desired image by controlling optical intensity in accordance with an output current from the driving element Qd. The light-emitting layer 202 is formed in the opening OP. The output current from the driving element Qd is applied to the anode PE, and the light-emitting layer 202 receives the output current from the anode PE. The anode PE transfers a plurality of holes to the light-emitting layer 202. The cathode CE covers the partition pattern 182 and the light-emitting layer 202. The cathode CE faces the anode PE, and provides electrons to the light-emitting layer 202. The electroluminescent element 200 is driven by the following method.

Firstly, when a gate signal is applied to the gate line 132, a timing signal is applied to the switching output electrode 164b from the switching input electrode 164a connected to the data line 162. Thus, the timing signal is applied to the driving control electrode 121 connected to the switching output electrode 164b. When the timing signal is applied to the driving control electrode 121, an electric channel is generated at the first active pattern AP1 of the driving element Qd, so that a driving voltage is applied to the anode PE from the driving voltage line 166.

After receiving the driving voltage, the anode PE provides a hole to the light-emitting layer 200. The cathode CE receives a common voltage from an external driving circuit part (not shown), and then provides an electron to the light-emitting layer 200. In the light-emitting layer 200, the hole and the electron provided from the anode PE and the cathode CE, respectively, are combined with each other to generate an exciton. The exciton falls to the ground state to generate light. Thus, the light is externally emitted from the light-emitting layer 200 through the anode PE.

In FIGS. 1 and 2, although one switching element and one driving element are illustrated, the display substrate may further include at least one thin-film transistor (TFT) and a plurality of wirings to drive the TFT, so that the electroluminescent element 200 and the driving element Qd may be prevented from being heated after a long time to prevent the lifetime of the display substrate from being shortened.

Hereinafter, a method of manufacturing a display substrate according to an exemplary embodiment of the present invention will be described with reference to FIGS. 3 to 12.

FIGS. 3 to 12 are cross-sectional views illustrating a method of manufacturing the display substrate illustrated in FIGS. 1 and 2.

Figure 3:
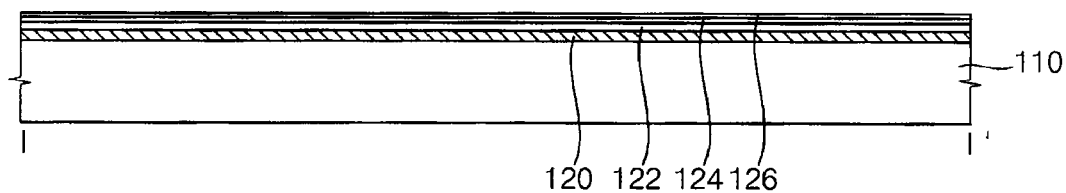
FIGS. 3 to 12 are cross-sectional views illustrating a method of manufacturing the display substrate illustrated in FIGS. 1 and 2.

Referring to FIG. 3, a first conductive layer 120, an insulation interlayer 122 and first active layers 124 and 126 are successively formed on a base substrate 110.

The base substrate 110 may include a transparent and electrically insulated substrate. The base substrate 110 may include, for example, a glass substrate, a plastic substrate, etc.

The first conductive layer 120 may include a conductive material through which electrons may pass. The first conductive layer 120 may include a metal layer. Alternatively, the first conductive layer 120 may include a semiconductor layer doped with n-type impurities at a high concentration. Since the first conductive layer 120 may be patterned and only used as a driving control electrode of a driving element, whether the first conductive layer 120 is made to be of low resistance may not be a critical factor. The first conductive layer 120 may be formed on the base substrate 110 with a thickness of, for example, about 500 Å.

The insulation interlayer 122 electrically insulates the first conductive layer 120 from the first active layers 124 and 126. The insulation interlayer 122 may include, for example, silicon nitride, silicon oxide, etc. The insulation interlayer 122 may be formed on the first conductive layer 120 with a thickness of, for example, about 1,000 Å to about 2,000 Å.

The first active layers 124 and 126 include a preliminary semiconductor layer 124 and a preliminary ohmic contact layer 126 successively formed on the insulation interlayer 122. The preliminary semiconductor layer 124 may include amorphous silicon. The preliminary ohmic contact layer 126 may include amorphous silicon doped with n-type impurities at a high concentration. The first active layers 124 and 126 may be formed on the insulation interlayer 122 with a thickness of, for example, about 500 Å to about 1,000 Å.

Thereafter, the first active layers 124 and 126 are crystallized. The first active layers 124 and 126 may be crystallized by using, for example, a solid phase crystallization (SPC) method. That is, the base substrate 110 having the first conductive layer 120, the insulation interlayer 122 and the first active layers 124 and 126 is heat-treated. The temperature of the heat-treatment may be in a range of, for example, about 600° C. to about 700° C. Thus, the first active layers 124 and 126 including amorphous silicon are crystallized into polysilicon.

Figure 4:
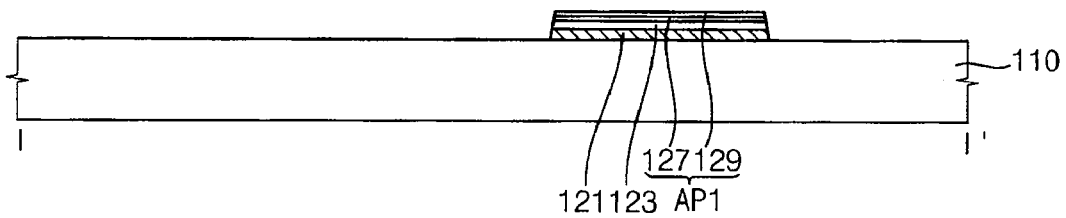

Referring to FIG. 4, a photoresist film (not shown) is formed on the base substrate 110 having the crystallized first active layers 124 and 126, and the photoresist film is patterned using one mask to form a photo pattern (not shown). Hereinafter, the crystallized preliminary semiconductor layer 124 is represented as a "first semiconductor layer 127," and the crystallized preliminary ohmic contact layer 126 is represented as a "first ohmic contact layer 129."

The first ohmic contact layer 129, the first semiconductor layer 127, the insulation interlayer 122 and the first conductive layer 120 are successively etched and patterned by using the photo pattern serving as an etch-stop layer. For example, the first ohmic contact layer 129, the first semiconductor layer 127 and the insulation interlayer 122 may be patterned through a dry etch process using dry gas. The first conductive layer 120 may be patterned by using dry etch or wet etch.

Thus, the first ohmic contact layer 129 and the first semiconductor layer 127 are patterned to form a first active pattern AP1, the insulation interlayer 122 is patterned to form an insulation pattern 123 disposed beneath the first active pattern AP1, and the first conductive layer 120 is patterned to form a driving control electrode 121 disposed beneath the insulation pattern 123.

As described above, the first conductive layer 120, the insulation interlayer 122 and the first active layers 124 and 126 are entirely formed on the base substrate 110, and the first active layers 124 and 126 are crystallized. After the first active layers 124 and 126 are crystallized, the driving control electrode 121, the insulation pattern 123 and the first active pattern AP1 are formed. Thus, misalignment between the driving control electrode 121 and the first active pattern AP1 may be prevented.

Figure 5:
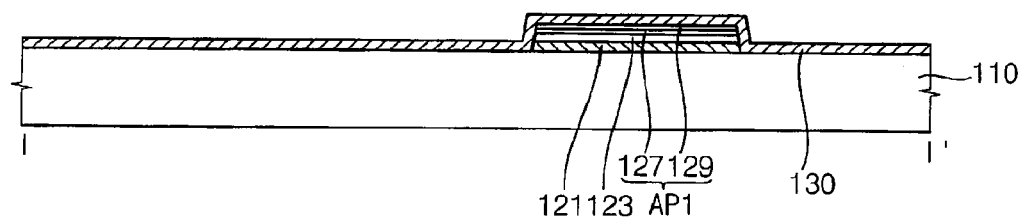

Referring to FIG. 5, a second conductive layer 130 is formed on the base substrate 110 having the driving control electrode 121, the insulation pattern 123 and the first active pattern AP1. The second conductive layer 130 may include, for example, a single metal such as aluminum (Al), molybdenum (Mo), neodymium (Nd), chromium (Cr), tantalum (Ta), titanium (Ti), tungsten (W), copper (Cu), silver (Ag), etc., or an alloy thereof. In addition, the second conductive layer 130 may include at least two metal layers, physical properties of which are different from each other.

A photoresist pattern (not shown) is formed on the base substrate 110 having the second conductive layer 130, and the second conductive layer 130 is patterned by using the photoresist pattern serving as an etch-stop layer. For example, the second conductive layer 130 may be patterned through a wet etch process.

Figure 6:
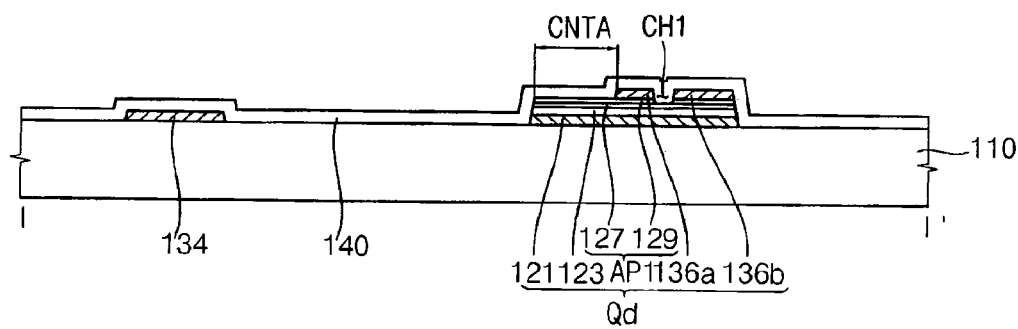

Referring to FIG. 6, the second conductive layer 130 is patterned to form a gate line 132 (not shown), a switching control electrode 134, a driving output electrode 136a and a driving input electrode 136b. Thus, a driving element Qd of the display substrate may be completed by forming the driving output electrode 136a and the driving input electrode 136b.

The gate line 132 and the switching control electrode 134 may make direct contact with the base substrate 110. In a process of forming the first active pattern AP1, the insulation interlayer 122 exists only on the driving control electrode 121 as insulation pattern 123, and the insulation interlayer 122 on the base substrate 110 except for the driving control electrode 121 is removed. Thus, the gate line 132 and the switching control electrode 134 may make direct contact with the base substrate 110. The switching control electrode 134 is connected to the gate line 132.

The driving output electrode 136a and the driving input electrode 136b are formed on the first active pattern AP1. The driving output electrode 136a and the driving input electrode 136b are spaced apart from each other. The first ohmic contact layer 129 may be exposed between the driving output electrode 136a and the driving input electrode 136b.

Then, the exposed first ohmic contact layer 129 is removed by using the driving output electrode 136a and the driving input electrode 136b serving as an etch-stop layer, and the first semiconductor layer 127 is exposed. Thus, a first channel portion CH1 of the driving element Qd may be formed.

In a process of patterning the second conductive layer 130, the second conductive layer 130 is etched so that the first active pattern AP1 formed over the driving control electrode 121 is partially exposed. An area corresponding to the exposed portion of the first active pattern AP1 is defined as a "contact area," and represented as "CNTA." In the following process, a first contact hole is formed through the contact area (refer to FIG. 3).

Then, a first insulation layer 140 is formed on the base substrate 110 having the switching control electrode 134 and the driving element Qd. The first insulation layer 140 may include, for example, silicon nitride, silicon oxide, etc.

Figure 7:
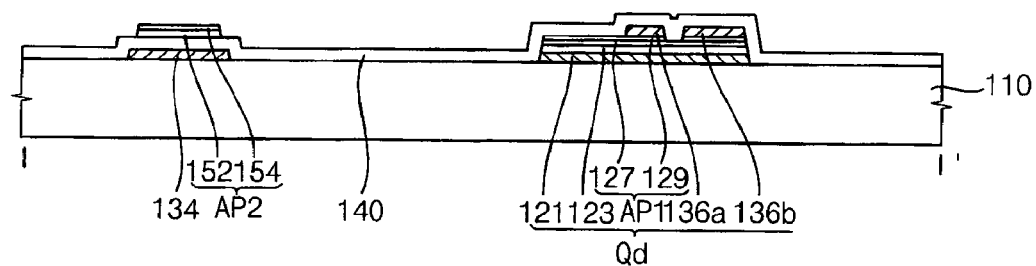

Referring to FIG. 7, a second semiconductor layer 152 and a second ohmic contact layer 154 are successively formed on the base substrate 110 having the first insulation layer 140. The second semiconductor layer 152 may include amorphous silicon. The second ohmic contact layer 154 may include amorphous silicon doped with n-type impurities at a high concentration.

The second semiconductor layer 152 and the second ohmic contact layer 154 are patterned to form a second active pattern AP2 remaining on the switching control electrode 134. The second semiconductor layer 152 and the second ohmic contact layer 154 are partially removed corresponding to an area of the base substrate 110 except for the switching control electrode 134, and may remain on the first insulation layer 140 corresponding to the switching control electrode 134 to form the second active pattern AP2.

Figure 8:
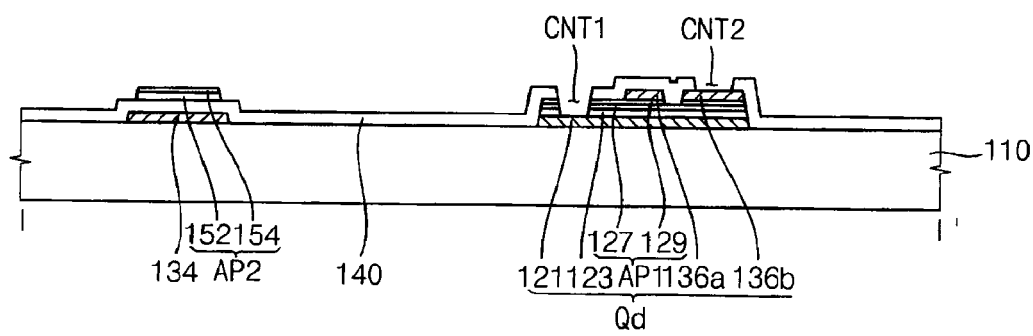

Referring to FIG. 8, the first insulation layer 140, the first active pattern AP1, and the insulation pattern 123 are partially removed in the contact area CNTA to form a first contact hole CNT1 partially exposing the driving control electrode 121.

Through the same process as the process of forming the first contact hole CNT1, the first insulation layer 140 is partially removed corresponding to the driving input electrode 136b to form a second contact hole CNT2 partially exposing the driving input electrode 136b.

Figure 9:
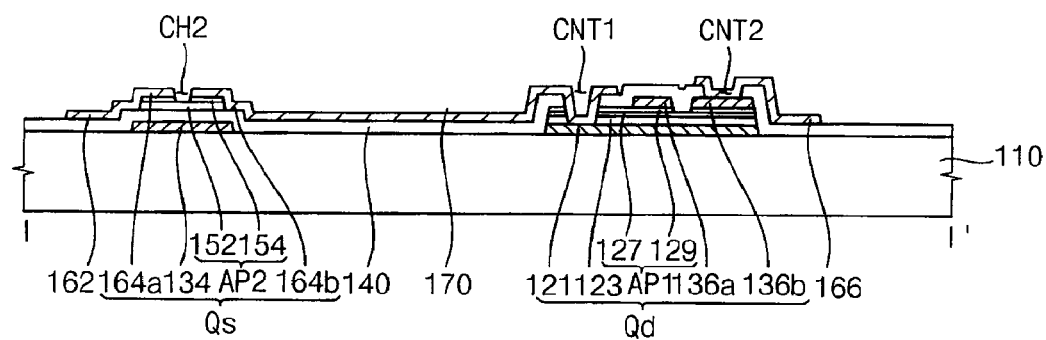

Referring to FIG. 9, a third conductive layer (not shown) is formed on the base substrate 110 having the first contact hole CNT1 and the second contact hole CNT2. The third conductive layer is patterned to form a data line 162, a switching input electrode 164a, a switching output electrode 164b and a driving voltage line 166. Thus, a switching element Qs of the display substrate may be completed by forming the switching input electrode 164a and the switching output electrode 164b.

The data line 162 crosses the gate line 132. The switching input electrode 164a is connected to the data line 162. The switching output electrode 164b is spaced apart from the switching input electrode 164a. The switching output electrode 164b extends to the driving control electrode 121 of the driving element Qd and makes contact with the driving control electrode 121 via the first contact hole CNT1. Since the switching output electrode 164b makes direct contact with the driving control electrode 121, the switching element Qs may be electrically connected to the driving element Qd.

The driving voltage line 166 makes direct contact with the driving input electrode 136b via the second contact hole CNT2. Thus, the driving voltage line 166 may be electrically connected to the driving element Qd.

Thereafter, the second ohmic contact layer 154 exposed between the switching input electrode 164a and the switching output electrode 164b is removed by using the switching input electrode 164a and the switching output electrode 164b serving as an etch-stop layer. Thus, the second semiconductor layer 152 is exposed to thereby form a second channel portion CH2 of the switching element Qs.

Figure 10:
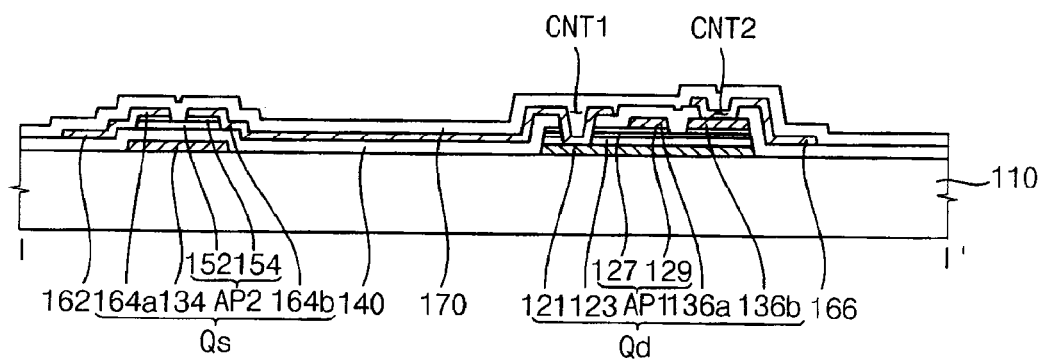

Referring to FIG. 10, a second insulation layer 170 is formed on the base substrate 110 having the data line 162, the switching element Qs, the driving element Qd and the driving voltage line 166. The second insulation layer 170 may include, for example, silicon nitride, silicon oxide, etc.

Figure 11:
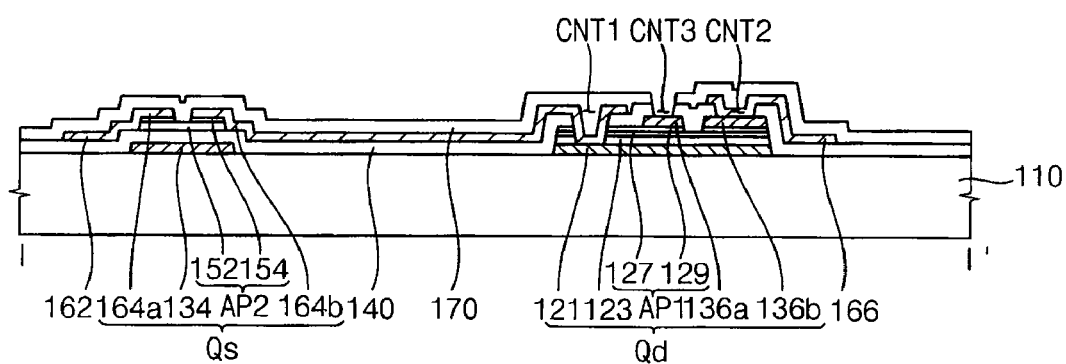

Referring to FIG. 11, the second insulation layer 170 and the first insulation layer 140 are partially removed corresponding to the driving output electrode 136a to form a third contact hole CNT3 partially exposing the driving output electrode 136a.

Then, a pixel electrode layer (not shown) is formed on the base substrate 110 having the third contact hole CNT3, and the pixel electrode layer is patterned to form an anode PE. The pixel electrode layer may make direct contact with the driving output electrode 136a via the third contact hole CNT3. Thus, the anode PE may be electrically connected to the driving element Qd via the third contact hole CNT3. The pixel electrode layer may include, for example, indium zinc oxide (IZO).

The anode PE may be formed, for example, corresponding to an area of the base substrate 110. The gate line 132 and the data line 162 cross each other, and the gate line 132 and the driving voltage line 166 cross each other, thereby defining the area of the base substrate 110. The area of the base substrate 110 may have a structure in which the first insulation layer 140 and the second insulation layer 170 are successively formed, the anode PE may be formed on the second insulation layer 170.

Figure 12:
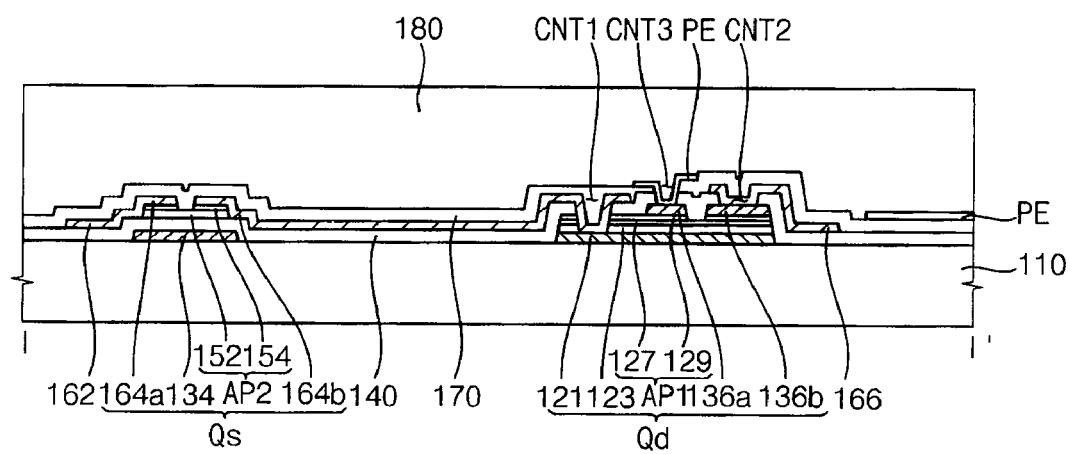

Referring to FIG. 12, a partition layer 180 is formed on the base substrate 110. The partition layer 180 may include an organic material having thermal resistance and solvent resistance such as acrylic resin, polyimide resin, etc. Alternatively, the partition layer 180 may include an inorganic material such as silicon oxide, titanium oxide, etc. The partition layer 180 may include a single layer or at least two layers. The partition layer 180 may include a photosensitive material including a black pigment.

The partition layer 180 is patterned to form a partition pattern 182 having an opening OP. The anode PE is partially exposed via the opening OP of the partition pattern 182. The partition pattern 182 covers the gate line 132, the data line 162, the driving voltage line 166, the switching element Qs and the driving element Qd. The partition pattern 182 also covers the anode PE making contact with the third contact hole CNT3.

A light-emitting layer 202 of the electroluminescent element 200 is formed in the opening OP of the base substrate 110 having the partition pattern 182. the light-emitting layer 202 may include at least a part of a hole injection layer, a hole transporting layer, an electron injection layer and an electron transporting layer. The light-emitting layer 202 may be formed, for example, by jetting a light-emitting material into the opening OP, or by using a thermal evaporation method.

Although not shown in FIG. 12, a protective layer, an absorption layer, etc. may be formed on the base substrate 110 having the light-emitting layer 202. In addition, a counter substrate (not shown) may be disposed over the base substrate 110 having the light-emitting layer 202 to protect the light-emitting layer 202 from water penetration and physical impact.

Thereafter, a cathode CE is formed on the base substrate 110 having the light-emitting layer 202. The cathode CE may include a material having a work function smaller than the anode PE. For example, the cathode CE may include an alkali metal, an alkaline earth metal, etc.

As described above, the first conductive layer 120, the insulation interlayer 122 and the first active layers 124 and 126 are entirely formed on the base substrate 110, and then the first active layers 124 and 126 are crystallized. After the first active layers 124 and 126 are crystallized, the driving control electrode 121, the insulation pattern 123 and the first active pattern AP1 are formed. Thus, misalignment between the driving control electrode 121 and the first active pattern AP1 may be prevented, thereby improving the reliability of products and manufacturing processes thereof.

In addition, the switching element Qs is directly contacted with and electrically connected to the driving element Qd, and the driving element Qd is directly contacted with and electrically connected to the driving voltage line 166, to thereby improve an aperture ratio of the display substrate. Thus, display quality may be enhanced.

According to the present invention, a driving control electrode, an insulation pattern and a first active pattern of a driving element are patterned by using one mask to prevent misalignment between the driving control electrode and the first active pattern. Thus, the reliability of products and manufacturing processes thereof may be improved.

In addition, the driving element and a switching element are directly contacted with and electrically connected to each other to increase an aperture ratio of the display substrate and enhance display quality.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display substrate comprising:
    a driving element comprising a driving control electrode formed from a first conductive layer, a first active pattern formed on the driving control electrode and having, in a plan view, a substantially same shape as the driving control electrode, and a driving input electrode and a driving output electrode that are formed from a second conductive layer and formed on the driving control electrode;
    a switching element comprising a switching control electrode formed from the second conductive layer, and a switching input electrode and a switching output electrode that are formed from a third conductive layer and formed on the switching control electrode;
    a gate line formed from the second conductive layer and connected to the switching control electrode;
    a data line formed from the third conductive layer and connected to the driving input electrode;
    a driving voltage line formed from the third conductive layer and electrically connected to the driving input electrode; and
    an electroluminescent element electrically connected to the driving output electrode, wherein the third conductive layer physically contacts the first conductive layer at the driving control electrode.

2. The display substrate of claim 1, wherein the first active pattern includes polysilicon and the driving element comprises:
    an insulation pattern formed between the driving control electrode and the first active pattern.

3. The display substrate of claim 2, further comprising:
    a first insulation layer covering the driving element; and
    a second insulation layer formed on the first insulation layer to cover the switching element.

4. The display substrate of claim 3, wherein the switching output electrode makes direct contact with the driving control electrode via a first contact hole formed through the insulation pattern, the first active pattern and the first insulation layer.

5. The display substrate of claim 4, wherein the driving voltage line makes direct contact with the driving input electrode via a second contact hole formed through the first insulation layer.

6. The display substrate of claim 5, wherein the electroluminescent element comprises:
    an anode making direct contact with the driving output electrode via a third contact hole formed through the first and second insulation layer;
    a cathode facing the anode; and
    a light-emitting layer interposed between the anode and the cathode.

7. The display substrate of claim 1, wherein the switching element comprises a second active pattern formed on the switching control electrode, the second active pattern including amorphous silicon.

* * * * *